US008598786B1

United States Patent
Kim et al.

(10) Patent No.: US 8,598,786 B1
(45) Date of Patent: Dec. 3, 2013

(54) ORGANIC LIGHT-EMITTING DISPLAY APPARATUS HAVING A HYDROXYQUINOLINE-BASED LAYER AS PART OF THE SEALING STRUCTURE AND METHOD OF MANUFACTURING THE SAME

(71) Applicant: Samsung Display Co., Ltd., Yongin-si (KR)

(72) Inventors: Nam-Jin Kim, Yongin-si (KR); Chul-Hwan Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/658,628

(22) Filed: Oct. 23, 2012

(51) Int. Cl.
*H01L 51/54* (2006.01)
*H01L 51/52* (2006.01)

(52) U.S. Cl.
USPC ............. 313/504; 313/507; 313/512; 445/24; 257/40

(58) Field of Classification Search
CPC ... G02B 26/41; H01L 51/5243; H01L 51/524
USPC .................... 313/498–512; 315/169.1–169.3; 428/690–691; 438/26–29, 34, 82; 257/40, 72, 98–100; 427/66, 532–535, 427/539
See application file for complete search history.

(56) References Cited

U.S. PATENT DOCUMENTS

| 2006/0097633 | A1  | 5/2006  | Cho et al. |
| 2006/0220549 | A1  | 10/2006 | Kim et al. |
| 2010/0171106 | A1* | 7/2010  | Jung et al. ........................ 257/40 |
| 2010/0200846 | A1* | 8/2010  | Kwack et al. .................... 257/40 |
| 2011/0163330 | A1* | 7/2011  | Kim et al. ........................ 257/88 |
| 2012/0146492 | A1* | 6/2012  | Ryu et al. ...................... 313/512 |

FOREIGN PATENT DOCUMENTS

| KR | 10-0659129 | 12/2006 |
| KR | 10-0669751 | 1/2007  |
| KR | 10-0670328 | 1/2007  |

* cited by examiner

*Primary Examiner* — Tracie Y Green
(74) *Attorney, Agent, or Firm* — Christie, Parker & Hale, LLP

(57) ABSTRACT

An organic light-emitting display apparatus includes: a substrate; a first electrode on the substrate; an organic emission layer on the first electrode; a second electrode on the organic emission layer; and a sealing layer including a capping film, a first inorganic film, a first organic film, a second inorganic film and a hydroxyquinoline-based blocking film between the second electrode and the first organic film that are sequentially stacked on the second electrode, the hydroxyquinoline-based blocking film comprising a hydroxyquinoline-based compound.

20 Claims, 5 Drawing Sheets

ORGANIC LIGHT-EMITTING DISPLAY APPARATUS HAVING A HYDROXYQUINOLINE-BASED LAYER AS PART OF THE SEALING STRUCTURE AND METHOD OF MANUFACTURING THE SAME

CROSS-REFERENCE TO RELATED PATENT APPLICATION

This application claims priority to and the benefit of Korean Patent Application No. 10-2012-0075751, filed on Jul. 11, 2012, in the Korean Intellectual Property Office, the disclosure of which is incorporated herein in its entirety by reference.

BACKGROUND

1. Field

The following description relates to an organic light-emitting display apparatus, and more particularly, to an organic light-emitting display apparatus including a hydroxyquinoline-based blocking film for protecting from oxygen and/or moisture permeation, and a method of manufacturing the organic light-emitting display apparatus.

2. Description of the Related Art

Organic light-emitting devices (OLEDs), which are self-emitting devices, have advantages such as wide viewing angles, excellent contrast, quick response, high brightness, excellent driving voltage characteristics, and can provide multicolored images. Due to these characteristics, OLEDs have been receiving growing attention.

In a common organic light-emitting device including an organic material layer, if oxygen and/or moisture permeates into the organic light-emitting device, the oxygen and/or moisture may bind to the organic material, and thus deteriorating characteristics of the organic light-emitting device. Therefore, to prevent the permeation of oxygen and/or moisture into the organic light-emitting device, a method of forming a sealing layer including organic and inorganic films on an upper surface of the organic light-emitting device has been applied.

However, when forming the sealing layer on the upper surface of the organic light-emitting device, the organic film of the sealing layer may be damaged during deposition of the inorganic film, thus producing oxygen and/or moisture, which may oxidize a cathode of the organic light-emitting device, and may often cause defects such as black spots.

Black spot defects are a failure occurring when oxygen and/or moisture produced from the damage of the organic film during the deposition of the inorganic film of the sealing layer is blocked by oxygen from Liq forming an electron injection layer under the cathode, thus forming an oxide film under the cathode.

To address this drawback, existing methods use, for example, CaO in liquid form as a moisture absorbing getter in forming the sealing layer. However, this liquid getter has opaque milky color and very low transmittivity, and thus has very limited applications; it is not applicable in flexible organic light-emitting devices.

SUMMARY

An aspect of an embodiment of the present invention is directed toward an organic light-emitting display apparatus for protecting from a black spot defect caused from permeation of oxygen or moisture.

An aspect of an embodiment of the present invention is directed toward an organic light-emitting display apparatus having a structure in which no black spot defect occurs with continuous sputtering in forming a sealing layer on an upper surface of the organic light-emitting device.

An aspect of an embodiment of the present invention is directed toward an organic light-emitting display apparatus including a sealing layer that has a high transmittivity and thus is applicable in flexible organic light-emitting devices.

According to one embodiment of the present invention, there is provided an organic light-emitting display apparatus including: a substrate; a first electrode on the substrate; an organic emission layer on the first electrode; a second electrode on the organic emission layer; and a sealing layer including a capping film, a first inorganic film, a first organic film, and a second inorganic film that are sequentially stacked on the second electrode and a hydroxyquinoline-based blocking film between the second electrode and the first organic film, the hydroxyquinoline-based blocking film including a hydroxyquinoline-based compound.

The hydroxyquinoline-based compound may include an oxygen atom with an electron lone pair.

The hydroxyquinoline-based compound may be at least one of Liq, Naq, $Znq_2$ and BAlq.

The first inorganic film and the second inorganic film may each independently include at least one selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride ($SiO_xN_y$).

The first organic film may include at least one selected from the group consisting of PPX (parylene(poly-p-xylene), PCPX (poly-2-chloro-p-zylylene), (poly[2-methoxy-r-(2'-ethylhexyloxy)-1,4-phenylene vinylene, polyurea, and polyamic acid.

The hydroxyquinoline-based blocking film may be between the capping film and the first inorganic film.

The hydroxyquinoline-based blocking film may contact the capping film.

The organic light-emitting display apparatus may further include a plurality of organic films and a plurality of inorganic films on the second inorganic film, wherein the plurality of organic films and the plurality of inorganic films may be alternatingly stacked.

The organic light-emitting display apparatus may further include a protective film between the hydroxyquinoline-based blocking film and the first inorganic film, the protective film including LiF.

The hydroxyquinoline-based blocking film may be between the second electrode and the capping film.

The hydroxyquinoline-based blocking film may contact the second electrode.

The organic light-emitting display apparatus may further include a plurality of organic films and a plurality of inorganic films on the second inorganic film, wherein the plurality of organic films and the plurality of inorganic films may be alternatingly stacked.

The organic light-emitting display apparatus may further include a protective film between the capping film and the first inorganic film, the protective film including LiF.

The hydroxyquinoline-based blocking film may be between the first inorganic film and the first organic film.

The hydroxyquinoline-based blocking film may contact the first inorganic film.

The organic light-emitting display apparatus may further include a plurality of organic films and a plurality of inorganic films on the second inorganic film, wherein the plurality of organic films and the plurality of inorganic films may be alternatingly stacked.

The organic light-emitting display apparatus may further include a protective film between the hydroxyquinoline-based blocking film and the first organic film, the protective film including LiF.

According to another embodiment of the present invention, there is provided a method of manufacturing an organic light-emitting display apparatus, the method including: preparing a substrate; forming a first electrode on the substrate; forming an organic emission layer on the first electrode; forming a second electrode on the organic emission layer; and forming a sealing layer on the second electrode, the forming of the sealing layer including: sequentially stacking a capping film, a first inorganic film, a first organic film, and a second inorganic film on the second electrode; and disposing a hydroxyquinoline-based blocking film between the second electrode and the first organic film, the hydroxyquinoline-based blocking film including a hydroxyquinoline-based compound.

The first inorganic film and the second inorganic film may each independently be disposed using one selected from the group consisting of sputtering, thermal evaporation, chemical vapor deposition (CVD), plasma enhanced chemical vapor deposition (PECVD), ion beam assisted deposition (IBAD), and atomic layer deposition (ALD).

The method may further include alternatingly forming a plurality of organic films and inorganic films on the second inorganic film.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
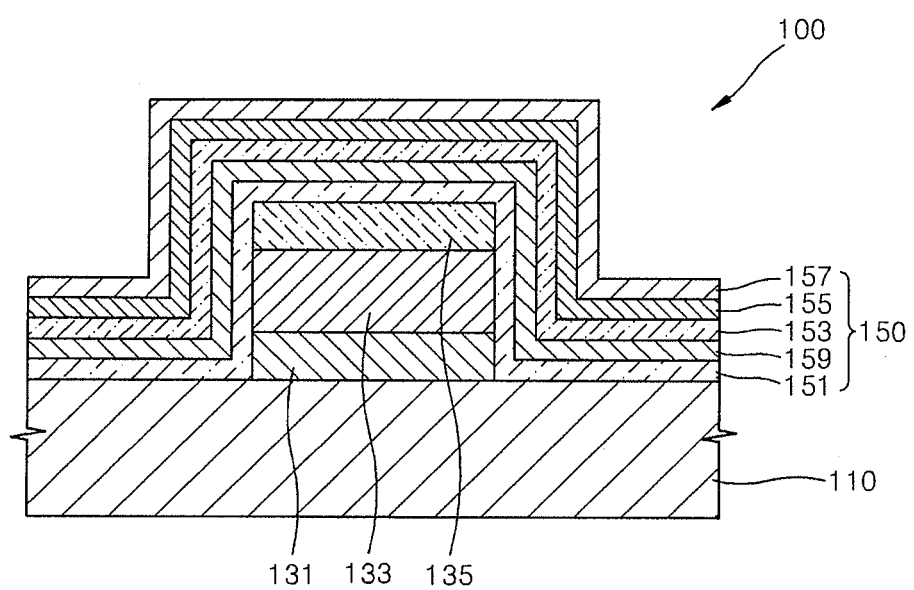
FIG. 1 is a schematic cross-sectional view of a structure of an organic light-emitting display apparatus according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list.

Reference will now be made in detail to the exemplary embodiments of the present general inventive concept, examples of which are illustrated in the accompanying drawings. The elements that are irrelevant with the present invention are not descried herein for clarity of the invention. Like reference numerals denote like elements throughout the specification. In the drawings, the thicknesses and sizes of layers or regions are exaggerated for clarity, and thus are not limited thereto.

FIG. 1 is a schematic cross-sectional view of a structure of an organic light-emitting display apparatus 100 according to an embodiment of the present invention.

Referring to FIG. 1, the organic light-emitting display apparatus 100 includes: a substrate 110; a first electrode 131 disposed on the substrate 110; an organic emission layer 133 disposed on the first electrode 131; a second electrode 135 disposed on the organic emission layer 133; and a sealing layer 150 disposed on the second electrode 135, wherein the sealing layer 150 includes a capping film 151, a first inorganic film 153, a first organic film 155, and a second inorganic film 157 that are sequentially stacked on the second electrode 135, and a hydroxyquinoline-based blocking film 159 disposed between the second electrode 135 and the first organic film 153 and including a hydroxyquinoline-based compound. For example, the hydroxyquinoline-based blocking film 159 may be disposed on the capping film 151.

The substrate 110 may be a common glass substrate or any flexible substrate, for example, a plastic substrate that is lightweight with a low specific gravity, less fragile, and processable to have a curved surface.

The first electrode 131 may be disposed on the substrate 110. The first electrode 131 may be disposed using vacuum deposition, sputtering, or the like. The first electrode 131 may be either a cathode or an anode. In some embodiments, the first electrode 131 may be an anode.

The first electrode 131 may be a transparent electrode, a semi-transparent electrode or a reflective electrode. A material for forming the first electrode 131 may be ITO, IZO, $SnO_2$, ZnO, Al, Ag, Mg, or the like, but is not limited thereto. In addition, the first electrode 131 may have any of various suitable structures, for example, a double or higher-layered structure including at least two different materials.

The organic emission layer 133 may be disposed on the first electrode 131.

The organic emission layer 133 may include any known light-emitting material. Non-limiting examples of the light-emitting material are known hosts (for example, $Alq_3$, CBP (4,4'-N,N'-dicarbazole-biphenyl), PVK (poly(n-vinylcarbazole)), or DSA (distyryl arylene); and known dopants, including red dopants, for example, PtOEP, $Ir(piq)_3$, $Btp_2Ir(acac)$, and DCJTB (4-(dicyanomethylene)-2-t-butyl-6-(1,1,7,7-tetramethyljulolidyl-9-enyl)-4H-pyran)), green dopants (for example, $Ir(ppy)_3$ (ppy=phenylpyridine), $Ir(ppy)_2(acac)$, and $Ir(mpyp)_3$), and blue dopants (for example, $F_2Irpic$, $(F_2ppy)_2Ir(tmd)$, $Ir(dfppz)_3$, and ter-fluorene).

Although not illustrated in FIG. 1, at least one of a hole injection layer, a hole transport layer, and a buffer layer that are sequentially staked upon one another, or a hole injection and transport layer having both hole injection and hole transport capabilities may be disposed between the organic emission layer 133 and the first electrode 131.

The second electrode 135 may be disposed on the organic emission layer 133. The second electrode 135 may be disposed using vacuum deposition, sputtering, or the like. The second electrode 135 may be either a cathode or an anode. In some embodiments, the first electrode 131 may be an anode while the second electrode 135 may be a cathode, but the reverse is also possible. A metal for forming the second electrode 135 may be a low work-function metal, an alloy, an electrically conductive compound, or a combination of these. Non-limiting examples of such materials are lithium (Li), magnesium (Mg), aluminum (Al), aluminum-lithium (Al—Li), calcium (Ca), magnesium-indium (Mg—In), and magnesium-silver (Mg—Ag). The second electrode 135 may have any of various suitable structures, for example, a double or higher-layered structure including at least two different materials.

Although not illustrated in FIG. 1, at least one of a hole blocking layer, an electron transport layer, and an electron injection layer that are sequentially staked upon one another, or an electron injection and transport layer having both electron injection and electron transport capabilities may be disposed between the organic emission layer 133 and the second electrode 135.

The sealing layer 150 may be disposed on the second electrode 135 in order to prevent (or protect from) permeation of oxygen and moisture into the organic light-emitting device.

The sealing layer 150 may include the capping film 151, the organic-inorganic composite films 153, 155, and 157, and the hydroxyquinoline-based blocking film 159. In some embodiments, the sealing layer 150 may have a structure in which the capping film 151, the hydroxyquinoline-based blocking film 159, the first inorganic film 153, the first organic film 155, and the second inorganic film 157 are sequentially stacked on the second electrode 135.

The capping film 151 for improving viewing angle characteristics and external emission efficiency may be disposed of an organic material having a different refractive index from that of air in order to help light be emitted from the organic light-emitting device.

The capping film 151 may have a thickness of from about 10 Å to about 2000 Å to attain improved transmission characteristics and viewing angle characteristics.

Although FIG. 1 illustrates the capping film 151 as a monolayer including a single material, the capping film 151 may be a stack of at least two layers having different refractive indices.

An organic material for forming the capping film 151 may be a triamine derivative, an arylenediamine derivative, a CBP. A non-limiting example of the organic material is at least one of a-NPD, NPB, TPD, and m-MTDATA. The capping film 151 may be disposed by coating a liquid material, or by sputtering, thermal evaporation, chemical vapor deposition (CVD), plasma enhanced chemical vapor deposition (PECVD), ion beam assisted deposition (IBAD), or atomic layer deposition (ALD).

The hydroxyquinoline-based blocking film 159 may be disposed on the capping film 151. The hydroxyquinoline-based blocking film 159, which may include 100% of the hydroxyquinoline-based compound, may be disposed below the first organic film 155 of the sealing layer 150 to prevent (or protect from) permeation of oxygen and/or moisture generated from the first organic film 155 into the organic light-emitting display apparatus.

The hydroxyquinoline-based compound that constitutes the hydroxyquinoline-based blocking film 159 may include an oxygen atom with an electron lone pair, which may strongly pull oxygen molecules migrating from the first organic film 155 toward the organic light-emitting device due to electrostatic attraction induced from an electronegativity difference with respect to another electron lone pair of an oxygen atom from the migrating oxygen molecules, so that oxygen permeation is suppressed. Furthermore, the oxygen atom in the hydroxyquinoline-based compound is apt to form a hydrogen bond with water molecules migrating from the first organic film 155 in which the water molecules are generated, toward the organic light-emitting device (including the first electrode 131, the organic emission layer 133, and the second electrode 135), so that moisture permeation may be suppressed. As described above, the hydroxyquinoline-based blocking film 159 may suppress permeation of oxygen and moisture into the organic light-emitting device, so that a black spot defect caused from the formation of a thick oxide film below the second electrode 135 may not occur.

The hydroxyquinoline-based compound may be at least one of Liq, Naq, $Znq_2$, $Alq_3$, and BAlq. In some embodiments, the hydroxyquinoline-based compound may be Liq:

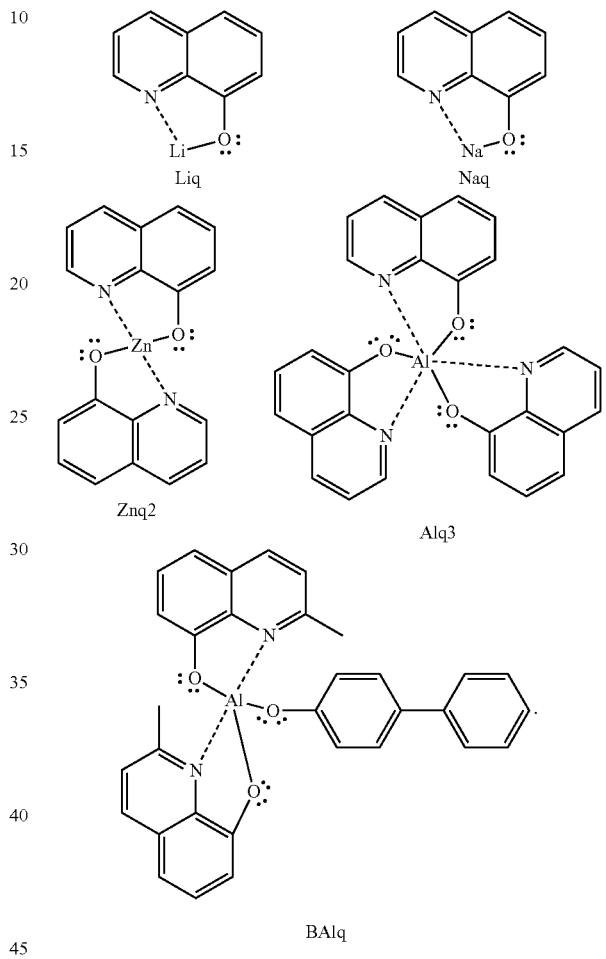

The hydroxyquinoline-based blocking film 159 may be disposed by coating a liquid material, or by sputtering, thermal evaporation, chemical vapor deposition (CVD), plasma enhanced chemical vapor deposition (PECVD), ion beam assisted deposition (IBAD), or atomic layer deposition (ALD).

An organic-inorganic composite film as a stack of alternating inorganic and organic films may be disposed on the hydroxyquinoline-based blocking film 159. That is, after the first inorganic film 153 is disposed on the hydroxyquinoline-based blocking film 159, the first inorganic film 153 and then the first organic film 155 may be sequentially disposed on the first inorganic film 153.

A material for the first inorganic film 153 and a material for the second inorganic film 157 may each independently be at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride ($SiO_xN_y$). Non-limiting examples of the materials for forming the first inorganic film 153 and the second inorganic film 157 are $SiO_2$, SiNx, and $Al_2O_3$. The first inorganic film 153 and the second inorganic film 157 may be disposed using sputtering, thermal evaporation, chemical vapor deposition (CVD), plasma enhanced chemical vapor deposition (PECVD), ion beam assisted deposition (IBAD), or atomic layer deposition (ALD).

A material for the first organic film 155 may be at least one of PPX (parylene(poly-p-xylylene), PCPX (poly-2-chloro-p-zylylene), (poly[2-methoxy-r-(2'-ethylhexyloxy)-1,4-phenylene vinylene, polyurea, and polyamic acid. The first organic film 155 may be disposed by coating a liquid material, or by sputtering, thermal evaporation, chemical vapor deposition (CVD), plasma enhanced chemical vapor deposition (PECVD), ion beam assisted deposition (IBAD), or atomic layer deposition (ALD).

The hydroxyquinoline-based blocking film 159 may be disposed between the capping film 151 and the first inorganic film 153. Oxygen or moisture generated from the first organic film 155 of the sealing layer 150 when the first organic film 155 is damaged during deposition of the second inorganic film 257 of the sealing layer 150 may be blocked or impeded before reaching the capping film 151, due to the electrostatic attraction by or hydrogen bonding with the hydroxyquinoline-based compound of the hydroxyquinoline-based blocking film 159, so that an oxide film may not be disposed (e.g., formed) under the second electrode 135 of the organic light-emitting display apparatus 100.

The hydroxyquinoline-based blocking film 159 may contact the capping film 151. As a result, oxygen and moisture generated from the first organic film 155 may be blocked or impeded by the first inorganic film 153 not to permeate through the same. Even if oxygen and moisture were to permeate the first inorganic film 153, the oxygen and moisture may be effectively blocked by the hydroxyquinoline-based blocking film 159 based on the above-described principle, and then may be further blocked by the capping film 151.

Although not illustrated in FIG. 1, a stack of a plurality of alternating organic and inorganic films may be further disposed on the second inorganic film 157. For example, a second organic film and a third inorganic film may be sequentially stacked on the second inorganic film 157. In some embodiments, a second organic film, a third inorganic film, a third organic film, and a fourth inorganic film may be sequentially stacked on the second inorganic film 157. In other embodiments, a plurality of alternating organic and inorganic films, e.g., a second organic film, a third inorganic film, a third organic film, a fourth inorganic film, a fourth organic film, and a fifth inorganic film may be sequentially stacked on the second inorganic film 157. The plurality of alternating organic and inorganic films stacked on the second inorganic film 157 may much effectively suppress permeation of oxygen and moisture.

Although not illustrated in FIG. 1, according to one embodiment of the present invention, a protective film may be further disposed between the hydroxyquinoline-based blocking film 159 and the first inorganic film 153. Because the protective film is disposed on the hydroxyquinoline-based blocking film 159, the protective film may protect the hydroxyquinoline-based blocking film 159 from being damaged during formation of a layer thereon. A material for the protective film may be LiF, but is not limited thereto.

Figure 2:
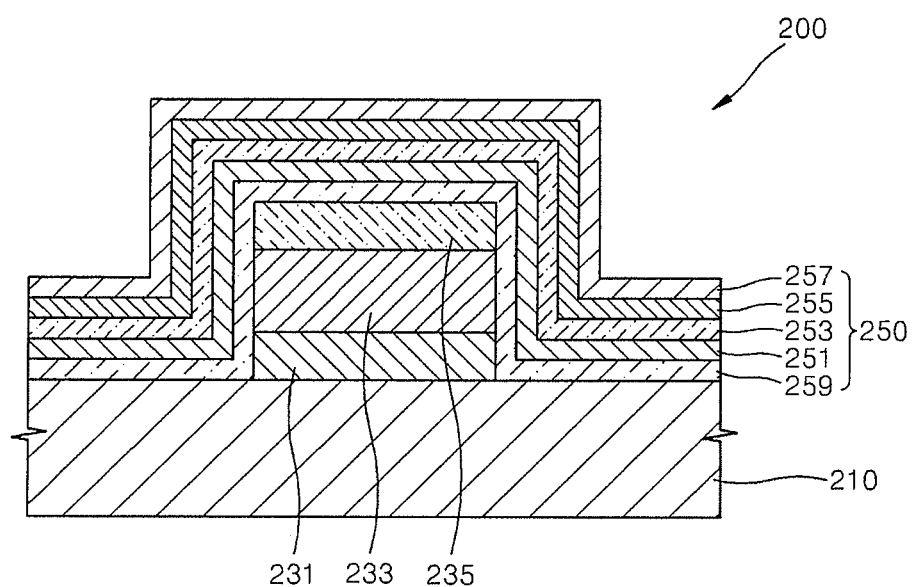
FIG. 2 is a schematic cross-sectional view of a structure of an organic light-emitting display apparatus according to another embodiment of the present invention.

FIG. 2 is a schematic cross-sectional view of a structure of an organic light-emitting display apparatus 200 according to an embodiment of the present invention.

Referring to FIG. 2, the organic light-emitting display apparatus 200 includes: a substrate 210; a first electrode 231 disposed on the substrate 210; an organic emission layer 233 disposed on the first electrode 231; a second electrode 235 disposed on the organic emission layer 233; and a sealing layer 251 disposed on the second electrode 235, wherein the sealing layer 250 includes a capping film 251, a first inorganic film 253, a first organic film 255, and a second inorganic film 257 that are sequentially stacked on the second electrode 235, and a hydroxyquinoline-based blocking film 259 disposed between the second electrode 235 and the first organic film 253 and including a hydroxyquinoline-based compound. For example, the hydroxyquinoline-based blocking film 259 may be disposed on the second electrode 235.

The above descriptions with reference to FIG. 1 may be referred to for descriptions of the substrate 210, the first electrode 231, the organic emission layer 233, and the second electrode 235.

The sealing layer 250 may be disposed on the second electrode and may prevent or reduce permeation of oxygen and/or moisture into the organic light-emitting display apparatus. The sealing layer 250 may include the capping film 251, organic-inorganic composite films 253, 255, and 257, and the hydroxyquinoline-based blocking film 259. For example, the sealing layer 250 may have a structure including the hydroxyquinoline-based blocking film 259, the capping film 251, the first inorganic film 253, the first organic film 255, and the second inorganic film 257 that are sequentially staked on the second electrode 235.

The above-descriptions with reference to FIG. 1 may be referred to for descriptions of the capping film 251, the first inorganic film 253, the first organic film 255, and the second inorganic film 257.

For example, the hydroxyquinoline-based blocking film 259 may be disposed on the second electrode 235. The hydroxyquinoline-based blocking film 259, which may be made entirely (100%) of the hydroxyquinoline-based compound, may be disposed below the first organic film 255 of the sealing layer 250 (e.g., disposed between the first organic film 255 of the sealing layer and the second electrode 235) to prevent permeation of oxygen and/or moisture generated from the first organic film 255 into the organic light-emitting display apparatus.

The hydroxyquinoline-based compound that constitutes the hydroxyquinoline-based blocking film 259 may include an oxygen atom with an electron lone pair, which may strongly pull oxygen molecules migrating from the first organic film 255 toward the organic light-emitting device due to electrostatic attraction induced from an electronegativity difference with respect to another electron lone pair of an oxygen atom from the migrating oxygen molecules, so that oxygen permeation is suppressed.

Furthermore, the oxygen atom in the hydroxyquinoline-based compound is apt to form a hydrogen bond with water molecules migrating from the first organic film 255 in which the water molecules are generated toward the organic light-emitting device, so that moisture permeation may be suppressed. As described above, the hydroxyquinoline-based blocking film 259 may suppress permeation of oxygen and moisture into the organic light-emitting device, so that a black spot defect caused from the formation of a thick oxide film below the second electrode 235 may not occur or the likelihood of forming such a black spot defect may be reduced.

The hydroxyquinoline-based compound may be at least one of Liq, Naq, $Znq_2$, $Alq_3$, and BAlq. In some embodiments, the hydroxyquinoline-based compound may be Liq. The hydroxyquinoline-based blocking film 259 may be disposed by coating a liquid material, or by sputtering, thermal evaporation, chemical vapor deposition (CVD), plasma enhanced chemical vapor deposition (PECVD), ion beam assisted deposition (IBAD), or atomic layer deposition (ALD).

The capping film 251 and the organic-inorganic composite film may be disposed on the hydroxyquinoline-based blocking film 259. That is, after the capping film 251 is disposed on the hydroxyquinoline-based blocking film 259, the organic-inorganic composite film, for example, including the first inorganic film 253, the first organic film 255, and the second inorganic film 257, may be disposed on the capping layer 251.

The hydroxyquinoline-based blocking film 259 may be disposed between the second electrode 235 and the capping film 251. Oxygen or moisture generated from the first organic film 255 of the sealing layer 250 when the first organic film 255 is damaged during deposition of the second inorganic film 257 of the sealing layer 150 may be blocked or impeded before reaching the second electrode 235, due to the electrostatic attraction by or hydrogen bonding with the hydroxyquinoline-based compound constituting the hydroxyquinoline-based blocking film 259, so that an oxide film may not be disposed (or formed) under the second electrode 235 of the organic light-emitting display apparatus 200.

The hydroxyquinoline-based blocking film 259 may contact the second electrode 235. As a result, oxygen and moisture generated from the first organic film 255 may be blocked (or impeded) by the first inorganic film 253 and the capping film 251 not to permeate through the same. Even if oxygen and moisture permeated the first inorganic film 253 and the capping film 251, the oxygen and moisture may be effectively blocked (or impeded) by the hydroxyquinoline-based blocking film 259 based on the above-described principle.

Although not illustrated in FIG. 2, a stack of a plurality of alternating organic and inorganic films may be further disposed on the second inorganic film 257. For example, a second organic film and a third inorganic film may be sequentially stacked on the second inorganic film 257. In some embodiments, a second organic film, a third inorganic film, a third organic film, and a fourth inorganic film may be sequentially stacked on the second inorganic film 257. In some other embodiments, a plurality of alternating organic and inorganic films, e.g., a second organic film, a third inorganic film, a third organic film, a fourth inorganic film, a fourth organic film, and a fifth inorganic film may be sequentially stacked on the second inorganic film 257. The plurality of alternating organic and inorganic films stacked on the second inorganic film 257 may effectively suppress permeation of oxygen and moisture.

Although not illustrated in FIG. 2, according to one embodiment of the present invention, a protective film may be further disposed between the capping film 251 and the first inorganic film 253. Because the protective film is disposed on the capping film 251, the protective film may protect the capping film 251 from being damaged during formation of a layer thereon. A material for the protective film may be LiF, but embodiments of the present invention are not limited thereto.

Figure 3:
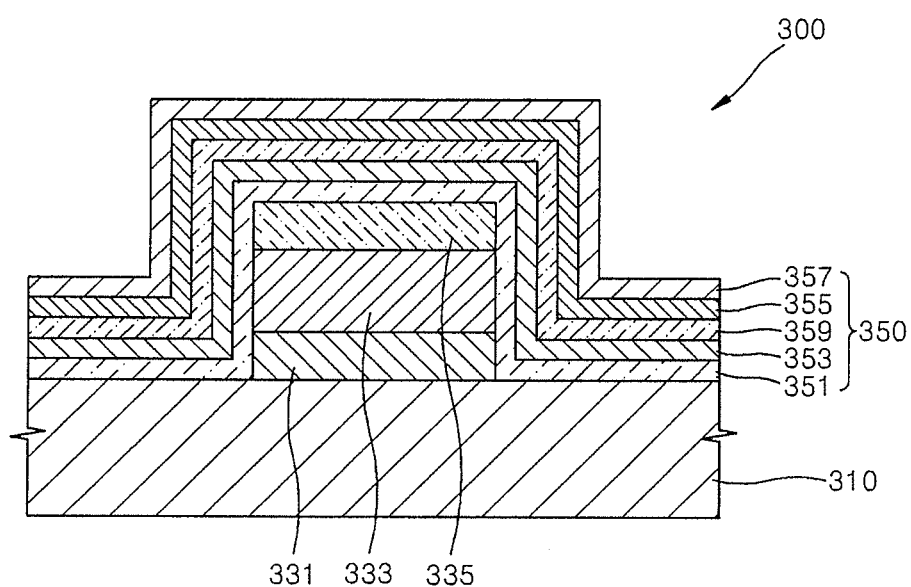
FIG. 3 is a schematic cross-sectional view of a structure of an organic light-emitting display apparatus according to another embodiment of the present invention.

FIG. 3 is a schematic cross-sectional view of a structure of an organic light-emitting display apparatus 300 according to another embodiment of the present invention.

Referring to FIG. 3, the organic light-emitting display apparatus 300 includes: a substrate 310; a first electrode 331 disposed on the substrate 310; an organic emission layer 333 disposed on the first electrode 331; a second electrode 335 disposed on the organic emission layer 333; and a sealing layer 350 disposed on the second electrode 335, wherein the sealing layer 350 includes a capping film 351, a first inorganic film 353, a first organic film 355, and a second inorganic film 357 that are sequentially stacked on the second electrode 335, and a hydroxyquinoline-based blocking film 359 disposed between the second electrode 335 and the first organic film 355 and including a hydroxyquinoline-based compound. For example, the hydroxyquinoline-based blocking film 359 may be disposed on the first inorganic film 353.

The above descriptions with reference to FIG. 1 may be referred to for descriptions of the substrate 310, the first electrode 331, the organic emission layer 333, and the second electrode 335.

The sealing layer 350 may be disposed on the second electrode 335 in order to prevent or reduce permeation of oxygen and/or moisture into the organic light-emitting display apparatus. The sealing layer 350 may include the capping film 351, organic-inorganic composite films 353, 355, and 357, and the hydroxyquinoline-based blocking film 359. For example, the sealing layer 350 may have a structure including the capping film 351, the first inorganic film 353, the hydroxyquinoline-based blocking film 359, the first organic film 355, and the second inorganic film 357 that are sequentially staked on the second electrode 335.

The above-descriptions with reference to FIG. 1 may be referred to for descriptions of the capping film 351, the first inorganic film 353, the first organic film 355, and the second inorganic film 357.

For example, the hydroxyquinoline-based blocking film 359 may be disposed on the first inorganic film 353. The hydroxyquinoline-based blocking film 359, which may be made entirely (100%) of the hydroxyquinoline-based compound, may be disposed below the first organic film 355 (e.g., between the first organic film 355 and the first inorganic film 353) of the sealing layer 350 to prevent or impede permeation of oxygen and/or moisture generated from the first organic film 355 into the organic light-emitting display apparatus.

The hydroxyquinoline-based compound that constitutes the hydroxyquinoline-based blocking film 359 according to one embodiment of the present invention may include an oxygen atom with an electron lone pair, which may strongly pull oxygen molecules migrating from the first organic film 355 toward the organic light-emitting device due to electrostatic attraction induced from an electronegativity difference with respect to another electron lone pair of an oxygen atom from the migrating oxygen molecules, so that oxygen permeation is suppressed. Furthermore, the oxygen atom in the hydroxyquinoline-based compound is apt to form a hydrogen bond with water molecules migrating from the first organic film 355 in which the water molecules are generated, toward the organic light-emitting device, so that moisture permeation may be suppressed. As described above, the hydroxyquinoline-based blocking film 359 may suppress permeation of oxygen and moisture into the organic light-emitting device, so that a black spot defect caused from the formation of a thick oxide film below the second electrode 335 may not occur.

The hydroxyquinoline-based compound may be at least one of Liq, Naq, $Znq_2$, $Alq_3$, and BAlq. In some embodiments, the hydroxyquinoline-based compound may be Liq. The hydroxyquinoline-based blocking film 259 may be disposed by coating a liquid material, or by sputtering, thermal evaporation, chemical vapor deposition (CVD), plasma enhanced chemical vapor deposition (PECVD), ion beam assisted deposition (IBAD), or atomic layer deposition (ALD).

An organic-inorganic composite film may be disposed on the hydroxyquinoline-based blocking film 359. For example, the first organic film 355 and the second inorganic film 357 may be sequentially disposed on the hydroxyquinoline-based blocking film 359.

The hydroxyquinoline-based blocking film 359 may be disposed between the first inorganic film 353 and the first organic film 355. Oxygen or moisture generated from the first organic film 353 of the sealing layer 350 when the first organic film 355 is damaged during deposition of the second inorganic film 357 of the sealing layer 350 may be blocked or impeded before reaching the second electrode 335, due to the electrostatic attraction by or hydrogen bonding with the hydroxyquinoline-based compound constituting the hydroxyquinoline-based blocking film 359, so that an oxide film may not be disposed (e.g., formed) below the second electrode 335 of the organic light-emitting display apparatus 300.

The hydroxyquinoline-based blocking film 359 may contact the first inorganic film 353. As a result, oxygen and moisture generated from the first organic film 355 may be effectively blocked or impeded by the hydroxyquinoline-based blocking film 359 based on the above-described principle, and then even further blocked or impeded by the first inorganic film 353 and the capping film 351.

Although not illustrated in FIG. 3, a stack of a plurality of alternating organic and inorganic films may be further disposed on the second inorganic film 357. For example, a second organic film and a third inorganic film may be sequentially stacked on the second inorganic film 357. In some embodiments, a second organic film, a third inorganic film, a third organic film, and a fourth inorganic film may be sequentially stacked on the second inorganic film 357. In some other embodiments, a plurality of alternating organic and inorganic films, e.g., a second organic film, a third inorganic film, a third organic film, a fourth inorganic film, a fourth organic film, and a fifth inorganic film may be sequentially stacked on the second inorganic film 357. The plurality of alternating organic and inorganic films stacked on the second inorganic film 357 may much effectively suppress permeation of oxygen and moisture.

Although not illustrated in FIG. 3, a protective film may be further disposed between the hydroxyquinoline-based blocking film 359 and the first organic film 355. Since being disposed on the hydroxyquinoline-based blocking film 359, the protective film may protect the hydroxyquinoline-based blocking film 359 from being damaged during formation of a layer thereon. A material for the protective film may be LiF, but embodiments of the present invention are not limited thereto.

According to another embodiment of the present invention, a method of manufacturing an organic light-emitting display apparatus includes: preparing a substrate; forming a first electrode on the substrate; forming an organic emission layer on the first electrode; forming a second electrode on the organic emission layer; and applying a sealing layer on the second electrode, the sealing layer including: a capping film, a first inorganic film, a first organic film, and a second inorganic film that are sequentially stacked on the second electrode; and a hydroxyquinoline-based blocking film disposed between the second electrode and the first organic film and including a hydroxyquinoline-based compound.

For example, the coating of the sealing layer may include sequentially stacking the capping film, the hydroxyquinoline-based blocking film, the first inorganic film, the first organic film, and the second inorganic film on the second electrode. In some embodiments, the coating of the sealing layer may include sequentially stacking the hydroxyquinoline-based blocking film, the capping film, the first inorganic film, the first organic film, and the second inorganic film on the second electrode. In some other embodiments, the coating of the sealing layer may include sequentially stacking the capping film, the first inorganic film, the hydroxyquinoline-based blocking film, the first organic film, and the second inorganic film on the second electrode.

The first inorganic film and second inorganic film constituting the sealing layer may each independently disposed using one of sputtering, thermal evaporation, CVD, PECVD, IBAD, and ALD. For example, even when oxygen or moisture is generated from the first organic film damaged due to continuous sputtering during formation of the first inorganic film or second inorganic film of the sealing layer, the hydroxyquinoline-based blocking film underlying the first inorganic film may suppress permeation of oxygen and moisture, and thus preventing or reducing the likelihood of a black spot defect.

The method of manufacturing an organic light-emitting display apparatus may further include alternatingly forming a plurality of organic films and a plurality of inorganic films to alternate on the second inorganic film. For example, the second organic film and the third inorganic film may be sequentially disposed on the second inorganic film. In some embodiments, the second organic film, the third, inorganic film, the third organic film, and the fourth inorganic film may be sequentially disposed on the second inorganic film. In some other embodiments, the second organic film, the third inorganic film, the third organic film, the fourth inorganic film, the fourth organic film, and a fifth inorganic film may be sequentially disposed on the second inorganic film. The above-described method in which a plurality of organic films and a plurality of inorganic films are alternatingly stacked on the second inorganic film may ensure more effective suppression of oxygen and moisture permeation with the sealing layer.

One or more embodiments of the present invention will now be described in detail with reference to the following examples. However, these examples are for illustrative purposes only and are not intended to limit the scope of the present invention.

EXAMPLE 1

To manufacture an anode, a Corning® 15 $\Omega/cm^2$ (500 Å) ITO glass substrate was cut to a size of 50 mm×50 mm×0.5 mm and then sonicated in isopropyl alcohol and pure water each for five minutes, and then cleaned by ultrasonication, followed by ultraviolet (UV) irradiation, and exposure to ozone for washing. The resulting glass substrate was loaded into a vacuum deposition device. 2-TNATA was vacuum-deposited on the ITO glass substrate to form a hole injection layer (HIL) having a thickness of 600 Å on the anode, and then NPS was vacuum-deposited on the HIL to form a hole transport layer (HTL) having a thickness of 300 Å. Ir(ppy)$_3$ as a dopant and CBP as a host were co-deposited on the HTL in a weight ratio of about 90:10 to form an emissive layer (EML) having a thickness of about 300 Å. Alq3 was vacuum-deposited on the EML to form an electron transport layer (ETL) having a thickness of 300 Å. Liq was deposited on the ETL to form an electron injection layer (EIL) having a thickness of 10 Å, followed by vacuum deposition of Al on the EIL to form a cathode having a thickness of 3000 Å, thereby completing the formation of Liq/Al electrodes.

NPB was vacuum-deposited on the cathode to form a capping (CPL) having a thickness of about 600 Å, followed by vacuum deposition of Liq on the capping film to form a hydroxyquinoline-based blocking film having a thickness of about 1000 Å, and vacuum deposition of LiF on the hydroxyquinoline-based blocking film to form a protective film having a thickness of about 500 Å.

Afterward, $Al_2O_3$ was vacuum-deposited on the protective film to form a first inorganic film having a thickness of about 1000 Å, followed by vacuum deposition of PPX on the first inorganic film to form a first organic film having a thickness of about 10000 Å, vacuum deposition of $Al_2O_3$ on the first organic film to form a second inorganic film having a thickness of about 1000 Å, vacuum deposition of PPX on the second inorganic film to form a second organic film having a thickness of about 10000 Å, vacuum deposition of $Al_2O_3$ on the second organic film to form a third inorganic film having a thickness of about 1000 Å, vacuum deposition of PPX on the third inorganic film to form a third organic film having a thickness of about 10000 Å, and vacuum deposition of $Al_2O_3$ on the third organic film to form a fourth inorganic film having a thickness of about 1000 Å, thereby completing the manufacture of an organic light-emitting display apparatus. That is, the sealing layer stacked on the cathode included a plurality of films stacked in the following order: cathode/hydroxyquinoline-based blocking film/capping film/protective film/first inorganic film/first organic film/second inorganic film/second organic film/third inorganic film/third organic film/fourth inorganic film.

EXAMPLE 2

An organic light-emitting display apparatus was manufactured in the same manner as in Example 1, except that the sealing layer stacked on the cathode was stacked in the following order: cathode/hydroxyquinoline-based blocking film/capping film/protective film/first inorganic film/first organic film/second inorganic film/second organic film/third inorganic film/third organic film/fourth inorganic film.

EXAMPLE 3

An organic light-emitting display apparatus was manufactured in the same manner as in Example 1, except that the sealing layer stacked on the cathode was stacked in the following order: cathode/capping film/first inorganic film/hydroxyquinoline-based blocking film/protective film/first organic film/second inorganic film/second organic film/third inorganic film/third organic film/fourth inorganic film.

COMPARATIVE EXAMPLE 1

An organic light-emitting display apparatus was manufactured in the same manner as in Example 1, except that the sealing layer stacked on the cathode was stacked in the following order: cathode/CaO blocking film/capping film/protective film/first inorganic film/first organic film/second inorganic film/second organic film/third inorganic film/third organic film/fourth inorganic film.

EVALUATION EXAMPLE

Three-dimensional ionic images of regions under cathodes of the organic light-emitting display apparatuses manufactured according to Examples 1 to 3 and Comparative Example 1, respectively, were obtained by time-of-flight secondary ion mass spectrometry (TOF-SIMS).

The results are shown in FIGS. 4A to 4D.

Figure 4A:
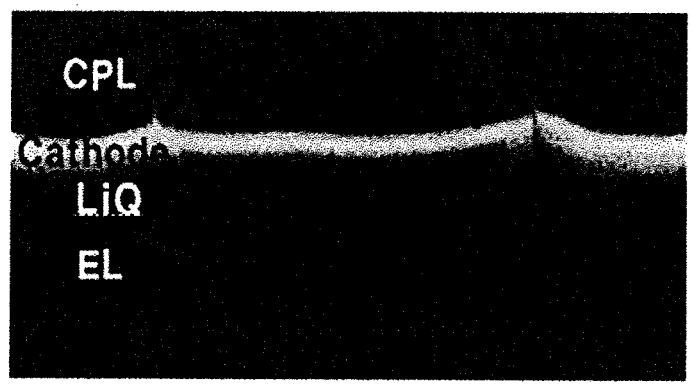
FIGS. 4A, 4B, 4C, and 4D are 3-dimensional ionic images of cathodes of the organic light-emitting display apparatuses according to Examples 1 to 3 and Comparative Example 1, respectively, obtained by time-of-flight secondary ion mass spectrometry (TOF-SIMS).
Figure 4B:
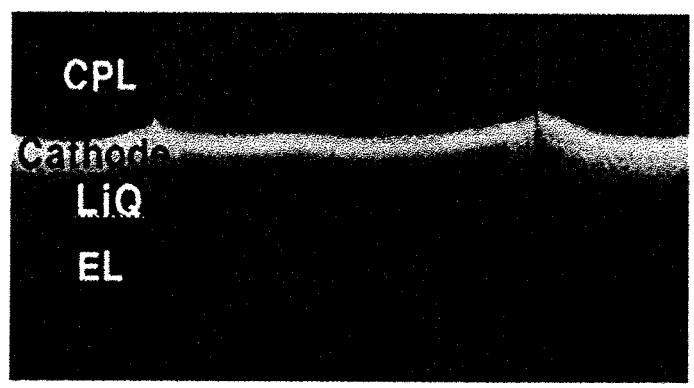
Figure 4C:
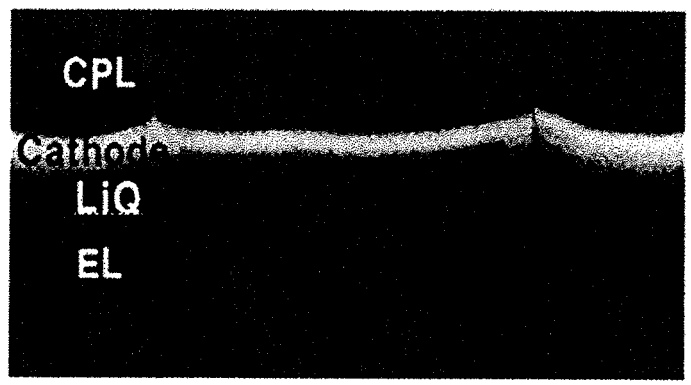
Figure 4D:

Referring to FIGS. 4A to 4C, no black spot defect was found in a region between the cathode and Liq in either of the organic light-emitting display apparatuses of Examples 1 to 3. However, referring to FIG. 4D, an oxide film was found in a region between the cathode and the electron injection layer of the organic light-emitting display apparatus of Comparative Example 1, so that a black spot defect occurred.

These results indicate that a black spot defect occurs in the organic light-emitting display apparatus of Comparative Example 1 because oxygen or moisture generated from a damaged organic film of the sealing layer migrates below the cathode and forms the oxide film between the cathode and the electron injection layer. Meanwhile, according to the organic light-emitting display apparatuses of Examples 1 to 3, the sealing layer itself may effectively block permeation of oxygen or moisture generated from a damaged organic film of the sealing layer, so that no black spot defect occur in a region underlying the cathode.

As described above, according to the one or more embodiments of the present inventions, an organic light-emitting display apparatus includes a sealing layer able to suppress or reduce permeation of oxygen or moisture, so that a black spot defect may not occur (or may be less likely to occur) in an organic light-emitting display apparatus.

According to the one or more embodiments, in the organic light-emitting display apparatus, a black spot defect may not occur even with a partial damage of an organic film of the sealing layer during formation of the sealing layer on an organic light-emitting device. This allows continuous sputtering without interruption to remove black spots, thus improving manufacturing efficiency.

The sealing layer of the organic light-emitting display apparatus may prevent black spots and may be formed to be transparent and thus be applicable in flexible organic light-emitting display apparatuses.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. An organic light-emitting display apparatus comprising:
   a substrate;
   a first electrode on the substrate;
   an organic emission layer on the first electrode;
   a second electrode on the organic emission layer; and
   a sealing layer comprising a capping film, a first inorganic film, a first organic film, and a second inorganic film that are sequentially stacked on the second electrode, and a hydroxyquinoline-based blocking film between the second electrode and the first organic film, the hydroxyquinoline-based blocking film comprising a hydroxyquinoline-based compound.

2. The organic light-emitting display apparatus of claim 1, wherein the hydroxyquinoline-based compound comprises an oxygen atom with an electron lone pair.

3. The organic light-emitting display apparatus of claim 1, wherein the hydroxyquinoline-based compound is at least one of Liq, Naq, $Znq_2$, and BAlq.

4. The organic light-emitting display apparatus of claim 1, wherein the first inorganic film and the second inorganic film each independently comprises at least one selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiOxNy).

5. The organic light-emitting display apparatus of claim 1, wherein the first organic film includes at least one selected from the group consisting of PPX (parylene(poly-p-xylylene), PCPX (poly-2-chloro-p-zylylene), (poly[2-methoxy-r-(2'-ethylhexyloxy)-1,4-phenylene vinylene, polyurea, and polyamic acid.

6. The organic light-emitting display apparatus of claim 1, wherein the hydroxyquinoline-based blocking film is between the capping film and the first inorganic film.

7. The organic light-emitting display apparatus of claim 6, wherein the hydroxyquinoline-based blocking film contacts the capping film.

8. The organic light-emitting display apparatus of claim 6, further comprising a plurality of organic films and a plurality of inorganic films on the second inorganic film, wherein the plurality of organic films and the plurality of inorganic films are alternatingly stacked.

9. The organic light-emitting display apparatus of claim 6, further comprising a protective film between the hydroxyquinoline-based blocking film and the first inorganic film, the protective film comprising LiF.

10. The organic light-emitting display apparatus of claim 1, wherein the hydroxyquinoline-based blocking film is between the second electrode and the capping film.

11. The organic light-emitting display apparatus of claim 10, wherein the hydroxyquinoline-based blocking film contacts the second electrode.

12. The organic light-emitting display apparatus of claim 10, further comprising a plurality of organic films and a plurality of inorganic films on the second inorganic film, wherein the plurality of organic films and the plurality of inorganic films are alternatingly stacked.

13. The organic light-emitting display apparatus of claim 10, further comprising a protective film between the capping film and the first inorganic film, the protective film comprising LiF.

14. The organic light-emitting display apparatus of claim 1, wherein the hydroxyquinoline-based blocking film is between the first inorganic film and the first organic film.

15. The organic light-emitting display apparatus of claim 14, wherein the hydroxyquinoline-based blocking film contacts the first inorganic film.

16. The organic light-emitting display apparatus of claim 14, further comprising a plurality of organic films and a plurality of inorganic films on the second inorganic film, wherein the plurality of organic films and the plurality of inorganic films are alternatingly stacked.

17. The organic light-emitting display apparatus of claim 14, further comprising a protective film between the hydroxyquinoline-based blocking film and the first organic film, the protective film comprising LiF.

18. A method of manufacturing an organic light-emitting display apparatus, the method comprising:
    preparing a substrate;
    forming a first electrode on the substrate;
    forming an organic emission layer on the first electrode;
    forming a second electrode on the organic emission layer; and
    forming a sealing layer on the second electrode, the forming of the sealing layer comprising: sequentially stacking a capping film, a first inorganic film, a first organic film, and a second inorganic film on the second electrode; and disposing a hydroxyquinoline-based blocking film between the second electrode and the first organic film, the hydroxyquinoline-based blocking film comprising a hydroxyquinoline-based compound.

19. The method of claim 18, wherein the first inorganic film and the second inorganic film are each independently disposed using one selected from the group consisting of sputtering, thermal evaporation, chemical vapor deposition (CVD), plasma enhanced chemical vapor deposition (PECVD), ion beam assisted deposition (IBAD), and atomic layer deposition (ALD).

20. The method of claim 18, further comprising alternatingly forming a plurality of organic films and inorganic films on the second inorganic film.

* * * * *